United States Patent
Chen et al.

(10) Patent No.: US 9,370,121 B2
(45) Date of Patent: Jun. 14, 2016

(54) CABLE MANAGEMENT DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Cheng-Chieh Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 131 days.

(21) Appl. No.: 14/222,811

(22) Filed: Mar. 24, 2014

(65) Prior Publication Data

US 2015/0271945 A1   Sep. 24, 2015

(51) Int. Cl.
| | |
|---|---|
| *F16L 3/00* | (2006.01) |
| *H05K 7/14* | (2006.01) |
| *F16L 3/015* | (2006.01) |
| *F16L 3/26* | (2006.01) |

(52) U.S. Cl.
CPC .............. *H05K 7/1491* (2013.01); *F16L 3/015* (2013.01); *F16L 3/26* (2013.01); *H05K 7/1489* (2013.01)

(58) Field of Classification Search
CPC .... H05K 7/1491; H05K 7/1489; F16L 3/015; F16L 3/26
USPC .................. 248/49, 51, 68.1; 52/745.12, 241, 52/745.4; 211/26
See application file for complete search history.

(56) References Cited

U.S. PATENT DOCUMENTS

| | | | | |
|---|---|---|---|---|
| 4,544,094 A | * | 10/1985 | Scholey | E01B 23/04 238/10 F |
| 5,240,209 A | * | 8/1993 | Kutsch | F16G 13/16 248/49 |
| 6,435,354 B1 | | 8/2002 | Gray et al. | |
| 6,637,173 B1 | * | 10/2003 | Wheeler | E04B 2/7457 52/241 |
| 6,902,069 B2 | | 6/2005 | Hartman et al. | |
| 7,073,299 B1 | * | 7/2006 | diGirolamo | E04B 2/7453 403/103 |
| 7,293,392 B2 | * | 11/2007 | Krumbacher | E04B 2/7457 403/103 |
| 7,359,218 B2 | | 4/2008 | McGrew | |
| 7,473,846 B2 | | 1/2009 | Doeer et al. | |
| 8,231,014 B2 | | 7/2012 | Chen et al. | |
| 8,379,410 B2 | | 2/2013 | Kitten | |
| 8,387,933 B2 | | 3/2013 | Yu et al. | |
| 8,453,403 B2 | * | 6/2013 | Wheeler | E04B 9/06 52/241 |
| 2007/0045479 A1 | * | 3/2007 | Nguyen | H05K 7/1491 248/49 |
| 2010/0181440 A1 | * | 7/2010 | Larsen | F16L 3/015 248/68.1 |
| 2013/0341471 A1 | * | 12/2013 | Yang | H05K 7/1491 248/70 |

* cited by examiner

*Primary Examiner* — Gwendolyn W. Baxter
(74) *Attorney, Agent, or Firm* — Rosenberg, Klein & Lee (57) ABSTRACT

A cable management device applicable to a rack server includes first and second support arms and a connecting member. The first support arm includes front and rear portions and a first guiding portion located at the front portion of the first support arm. The second support arm includes front and rear portions and a first guiding portion located at the front portion of the second support arm. The connecting member, movably connected between the first and second support arms, includes front and rear guiding portions. The first guiding portion of the first support arm and the first guiding portion of the second support arm are movable along and relative to the front and rear guiding portions of the connecting member respectively.

10 Claims, 8 Drawing Sheets

CABLE MANAGEMENT DEVICE

FIELD OF THE INVENTION

The present invention relates to a cable management device and more particularly to a cable management device applicable to a rack server.

BACKGROUND OF THE INVENTION

A rack server is a server mounted on a rack. Generally speaking, each of two corresponding lateral sides of a rack server is equipped with a slide rail assembly via which the server is mounted to a rack and which allows the server to be pulled out from the rack and pushed back into the rack in a similar way to a drawer.

Typically, a rack server has or is connected with a large number of electronic cables. While the server is pulled out from or pushed into a rack by means of a pair of slide rail assemblies, the cables may become untidy unless a device for managing or receiving the cables is used.

U.S. Pat. No. 8,379,410 discloses a reversible cable management arm system which essentially includes two connected cable support arms (138, 140) and a pivotable connector (150) located between the two cable support arms (138, 140). As shown in FIG. 6 and FIG. 7 of the '410 patent, one of the cable support arms (138) is connected with a second attachment member (152b), which is pivotally connected to a snap-on connector (160). The snap-on connector (160) is connected to the connector receiver (154) of a first slide member (134a). The other cable support arm (140) is connected with a first attachment member (152a), which is pivotally connected to another snap-on connector (158). This snap-on connector (158) is connected to the connector receiver (154) of a second slide member (134b). The cable support arm (138) and the second attachment member (152b) are interconnected by a tension member (172), and the cable support arm (140) and the first attachment member (152a) are interconnected by another tension member (170).

According to the disclosure of the '410 patent, cables (142) can remain tidy in the course where a server chassis (130) is pulled out from or pushed into a rack (132). In addition, the tension members (170, 172) respectively render the first attachment member (152a) and the second attachment member (152b) reversible in direction so that the folding direction of the cables (142) can be maintained.

However, the tension members (170, 172), which are springs, may undergo elastic fatigue or even become rusty after long-term use. In either case, the function of the cable management arm system as a whole will be compromised.

SUMMARY OF THE INVENTION

The present invention relates to a cable management device for use with a rack server.

According to one aspect of the present invention, a cable management device applicable to a rack server includes a first support arm, a second support arm, and a connecting member. The first support arm includes a front portion, a rear portion, and a first guiding portion located at the front portion of the first support arm. The second support arm includes a front portion, a rear portion, and a first guiding portion located at the front portion of the second support arm. The connecting member is movably connected between the first support arm and the second support arm. The connecting member includes a front guiding portion and a rear guiding portion. The first guiding portion of the first support arm can move along and relative to the front guiding portion of the connecting member, and the first guiding portion of the second support arm can move along and relative to the rear guiding portion of the connecting member.

Preferably, each of the front guiding portion and the rear guiding portion of the connecting member is a curved groove, and each of the first guiding portion of the first support arm and the first guiding portion of the second support arm is a protruding block movable only within the limited space defined by the corresponding one of the curved grooves. Each of the curved grooves defines a path corresponding to a 90-degree circular arc.

According to another aspect of the present invention, a cable management device applicable to a chassis is provided, wherein the chassis has a lateral side mounted to a rack by means of a slide rail assembly. The cable management device includes a first cable management arm which includes a first support arm, a second support arm, a first connecting member, a third support arm, and a second connecting member. The first support arm includes a front portion, a rear portion, a first guiding portion located at the front portion of the first support arm, and a second guiding portion located at the rear portion of the first support arm. The second support arm includes a front portion, a rear portion, a first guiding portion located at the front portion of the second support arm, and a second guiding portion located at the rear portion of the second support arm. The first connecting member is movably connected between the front portion of the first support arm and the front portion of the second support arm. The first connecting member includes a front guiding portion and a rear guiding portion. The third support arm includes a front portion, a rear portion, a first guiding portion located at the front portion of the third support arm, and a second guiding portion located at the rear portion of the third support arm. The second connecting member is movably connected between the rear portion of the second support arm and the rear portion of the third support arm. The second connecting member includes a front guiding portion and a rear guiding portion. The rear portion of the first support arm is movably connected to the chassis. The front portion of the third support arm is movably connected to one of the slide rail assembly and the rack. When the chassis is pulled out from the rack via the slide rail assembly, the first guiding portion of the first support arm is moved along and relative to the front guiding portion of the first connecting member, the first guiding portion of the second support arm is moved along and relative to the rear guiding portion of the first connecting member, the second guiding portion of the second support arm is moved along and relative to the front guiding portion of the second connecting member, and the second guiding portion of the third support arm is moved along and relative to the rear guiding portion of the second connecting member; as a result, the first support arm, the first connecting member, the second support arm, the second connecting member, and the third support arm are driven to an extended position.

Preferably, the cable management device further includes a first support member and a second support member. The first support member is connected between the chassis and the rear portion of the first support arm. The second support member is connected either between the slide rail assembly and the front portion of the third support arm or between the rack and the front portion of the third support arm.

Preferably, the front guiding portions and the rear guiding portions of the first connecting member and the second connecting member are curved grooves; and the first guiding portion of the first support arm, the first guiding portion and the second guiding portion of the second support arm, and the second guiding portion of the third support arm are protruding blocks respectively movable only within the limited spaces respectively defined by the curved grooves. Each of the curved grooves defines a path corresponding to a 90-degree circular arc.

According to yet another aspect of the present invention, a cable management device applicable to a chassis is provided, wherein the chassis is mounted to a rack by means of a pair of slide rail assemblies. The cable management device includes a first cable management arm and a second cable management arm. At least one of the first cable management arm and the second cable management arm at least includes a first support arm, a second support arm, a first connecting member, a third support arm, and a second connecting member. The first support arm includes a front portion, a rear portion, a first guiding portion located at the front portion of the first support arm, and a second guiding portion located at the rear portion of the first support arm. The second support arm includes a front portion, a rear portion, a first guiding portion located at the front portion of the second support arm, and a second guiding portion located at the rear portion of the second support arm. The first connecting member is movably connected between the front portion of the first support arm and the front portion of the second support arm. The first connecting member includes a front guiding portion and a rear guiding portion. The third support arm includes a front portion, a rear portion, a first guiding portion located at the front portion of the third support arm, and a second guiding portion located at the rear portion of the third support arm. The second connecting member is movably connected between the rear portion of the second support arm and the rear portion of the third support arm. The second connecting member includes a front guiding portion and a rear guiding portion. The rear portion of the first support arm is movably connected to the chassis. The front portion of the third support arm is movably connected to one of the slide rail assemblies or is movably connected to the rack. When the chassis is pulled out from the rack via the slide rail assemblies, the first guiding portion of the first support arm is moved along and relative to the front guiding portion of the first connecting member, the first guiding portion of the second support arm is moved along and relative to the rear guiding portion of the first connecting member, the second guiding portion of the second support arm is moved along and relative to the front guiding portion of the second connecting member, and the second guiding portion of the third support arm is moved along and relative to the rear guiding portion of the second connecting member; as a result, the first support arm, the first connecting member, the second support arm, the second connecting member, and the third support arm are driven to an extended position.

Preferably, the cable management device further includes a first support member, a second support member, a third support member, and a fourth support member. The first support member is movably connected between the chassis and the first cable management arm. The second support member is movably connected between the first cable management arm and one of the slide rail assemblies. The third support member is movably connected between the chassis and the second cable management arm. The fourth support member is movably connected between the second cable management arm and the other one of the slide rail assemblies. In addition, the first support member and the third support member are respectively connected to the chassis at positions adjacent to a rear middle part of the chassis.

BRIEF DESCRIPTION OF THE DRAWINGS

The invention as well as a preferred mode of use and the advantages thereof will be best understood by referring to the following detailed description of some illustrative embodiments in conjunction with the accompanying drawings, wherein.

DETAILED DESCRIPTION OF THE INVENTION

Figure 1:
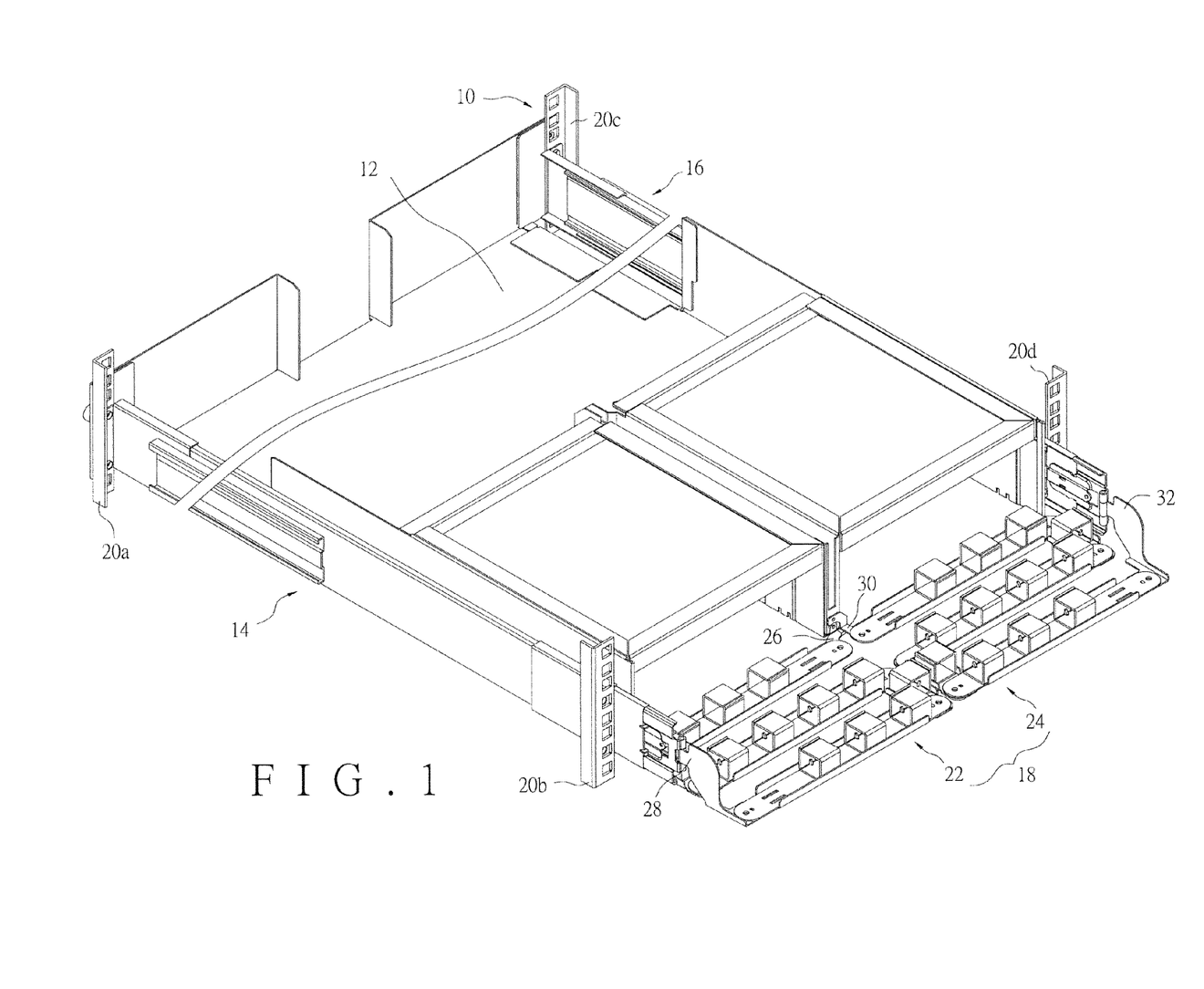
FIG. 1 is a perspective view in which the cable management device in one embodiment of the present invention is applied to a rack server.

FIG. 1 shows a rack 10, a chassis 12, a first slide rail assembly 14, a second slide rail assembly 16, and a cable management device 18. The rack 10 includes a first post 20a, a second post 20b, a third post 20c, and a fourth post 20d. The first post 20a and the second post 20b correspond in position to the third post 20c and the fourth post 20d respectively. The chassis 12 has one lateral side mounted between the first post 20a and the second post 20b of the rack 10 by means of the first slide rail assembly 14. The opposite lateral side of the chassis 12 is mounted between the third post 20c and the fourth post 20d of the rack 10 by means of the second slide rail assembly 16. The cable management device 18 includes at least one cable management arm and preferably includes a first cable management arm 22 and a second cable management arm 24. The first cable management arm 22 and the second cable management arm 24 have substantially the same structural features. The first cable management arm 22 is movably connected between the chassis 12 and the first slide rail assembly 14. The second cable management arm 24 is movably connected between the chassis 12 and the second slide rail assembly 16.

In one preferred embodiment, a first support member 26 is movably connected between the chassis 12 and the first cable management arm 22, and a second support member 28 is movably connected between the first cable management arm 22 and the first slide rail assembly 14. Similarly, a third support member 30 is movably connected between the chassis 12 and the second cable management arm 24, and a fourth support member 32 is movably connected between the second cable management arm 24 and the second slide rail assembly 16. Preferably, the first support member 26 and the third support member 30 are respectively connected to the chassis 12 at positions adjacent to a rear middle part of the chassis 12.

Figure 2:
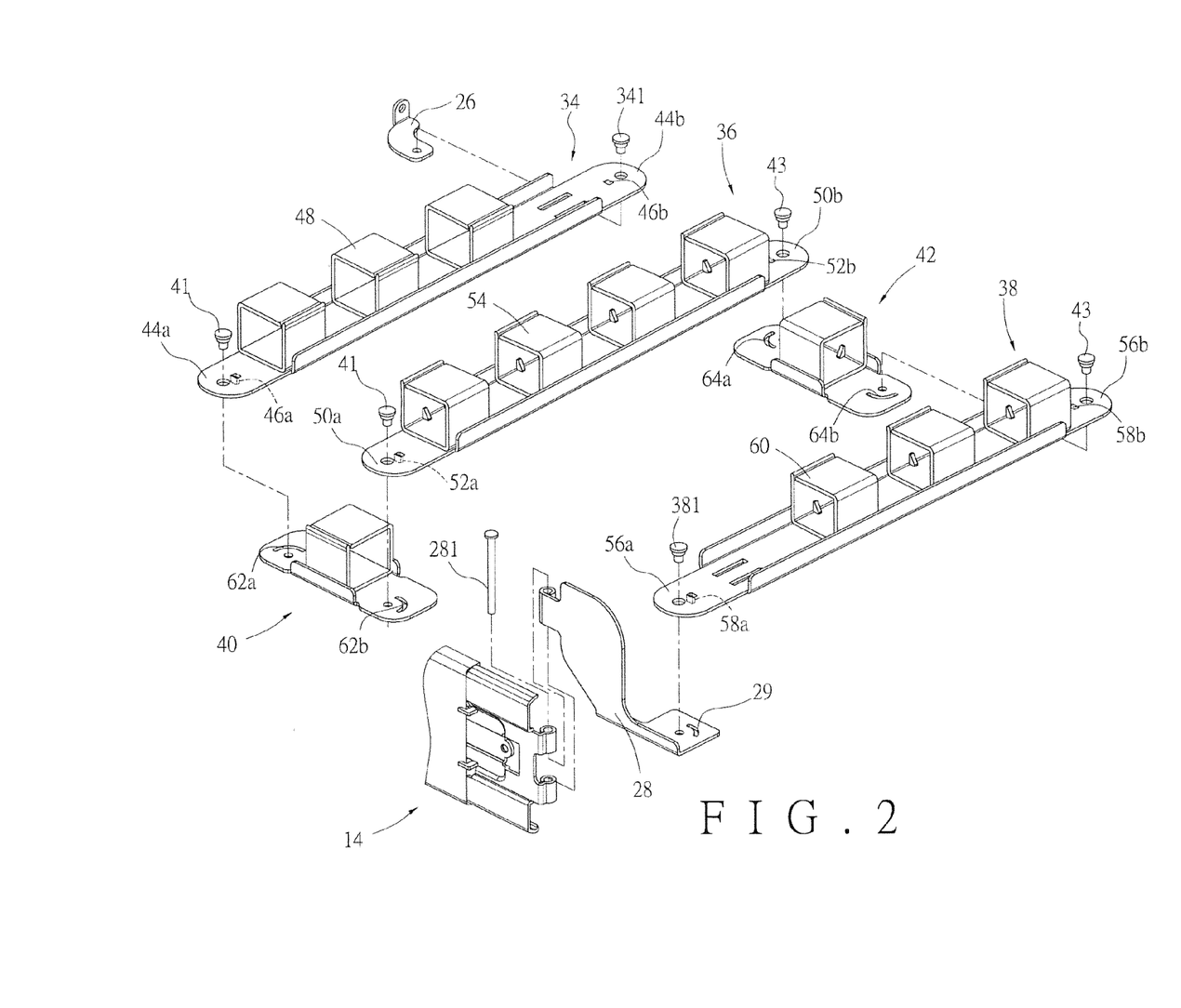
FIG. 2 is an exploded perspective view of one lateral half of the cable management device in FIG. 1.
Figure 3:
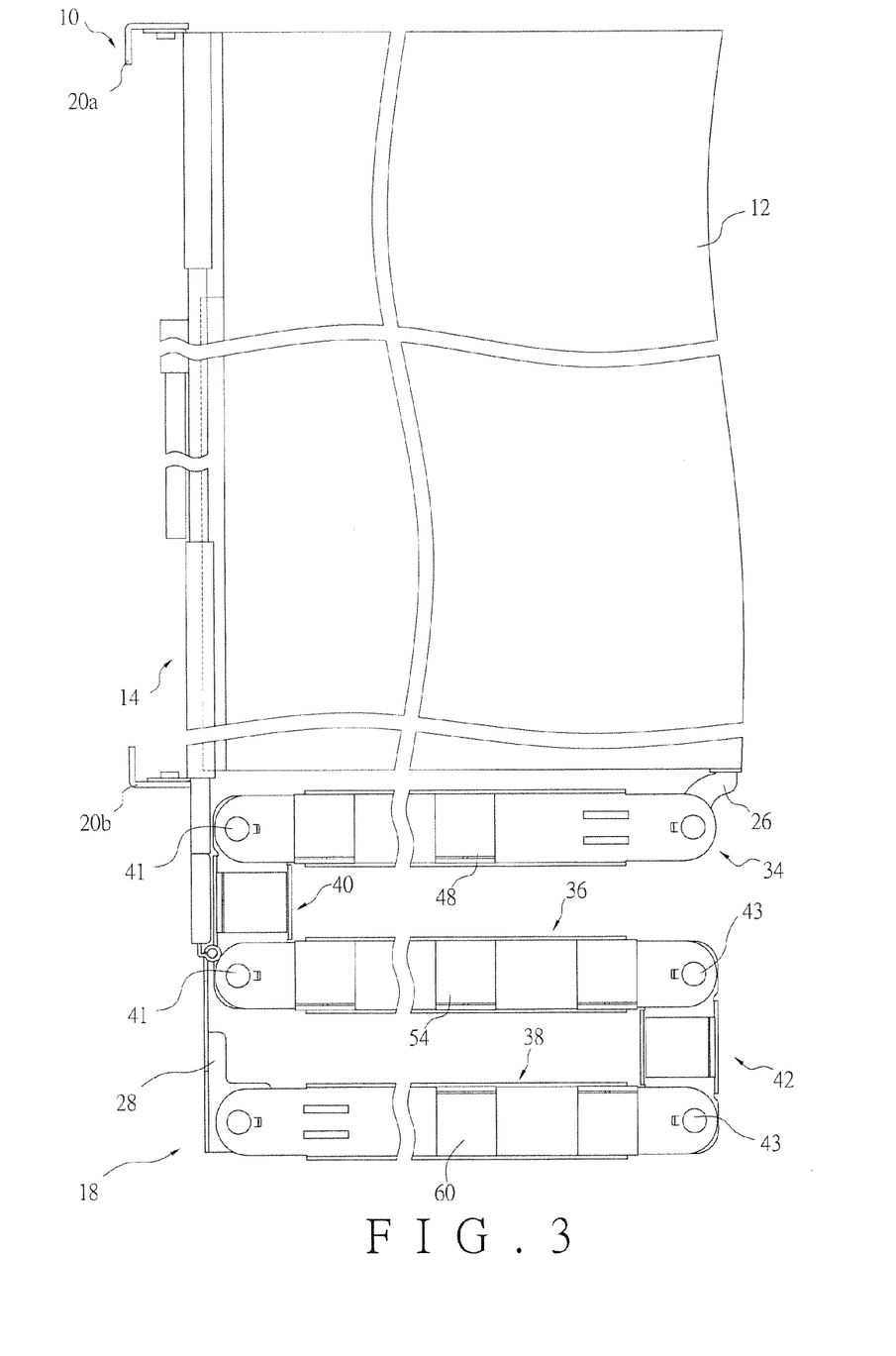
FIG. 3 is a top view of one lateral half of the cable management device in FIG. 1.

The first cable management arm is now described in more detail with reference to FIG. 2 and FIG. 3. The first cable management arm includes a first support arm 34, a second support arm 36, a third support arm 38, a first connecting member 40, and a second connecting member 42. The first connecting member 40 is movably connected between the first support arm 34 and the second support arm 36. The second connecting member 42 is movably connected between the second support arm 36 and the third support arm 38.

The first support arm 34 includes a front portion 44a, a rear portion 44b, a first guiding portion 46a located at the front portion 44a, a second guiding portion 46b located at the rear portion 44b, and a plurality of cable management elements 48 for cable management. The first guiding portion 46a and the second guiding portion 46b are configured in the same way.

The second support arm 36 includes a front portion 50a, a rear portion 50b, a first guiding portion 52a located at the front portion 50a, a second guiding portion 52b located at the rear portion 50b, and a plurality of cable management elements 54 for cable management. The first guiding portion 52a and the second guiding portion 52b are configured in the same way.

The third support arm 38 includes a front portion 56a, a rear portion 56b, a first guiding portion 58a located at the front portion 56a, a second guiding portion 58b located at the rear portion 56b, and a plurality of cable management elements 60 for cable management. The first guiding portion 58a and the second guiding portion 58b are configured in the same way.

The first connecting member 40 is movably connected between the first support arm 34 and the second support arm 36. The first connecting member 40 includes a front guiding portion 62a and a rear guiding portion 62b. Preferably, the first connecting member 40 is pivotally connected between the first support arm 34 and the second support arm 36 via a pair of first pivot elements 41.

The second connecting member 42 is movably connected between the second support arm 36 and the third support arm 38. The second connecting member 42 includes a front guiding portion 64a and a rear guiding portion 64b. Preferably, the second connecting member 42 is pivotally connected between the second support arm 36 and the third support arm 38 via a pair of second pivot elements 43.

More specifically, the first support arm 34 is pivotally connected to the first support member 26 via a third pivot element 341, wherein the first support member 26 is connected to the chassis 12. The third support arm 38 is pivotally connected to the second support member 28 via a fourth pivot element 381, and the second support member 28 is pivotally connected to the first slide rail assembly 14 via a fifth pivot element 281. Preferably, the second support member 28 has a curved groove 29 corresponding to the first guiding portion 58a of the third support arm 38, and the first guiding portion 58a is a protruding block movable only within the limited space defined by the curved groove 29.

Figure 4:
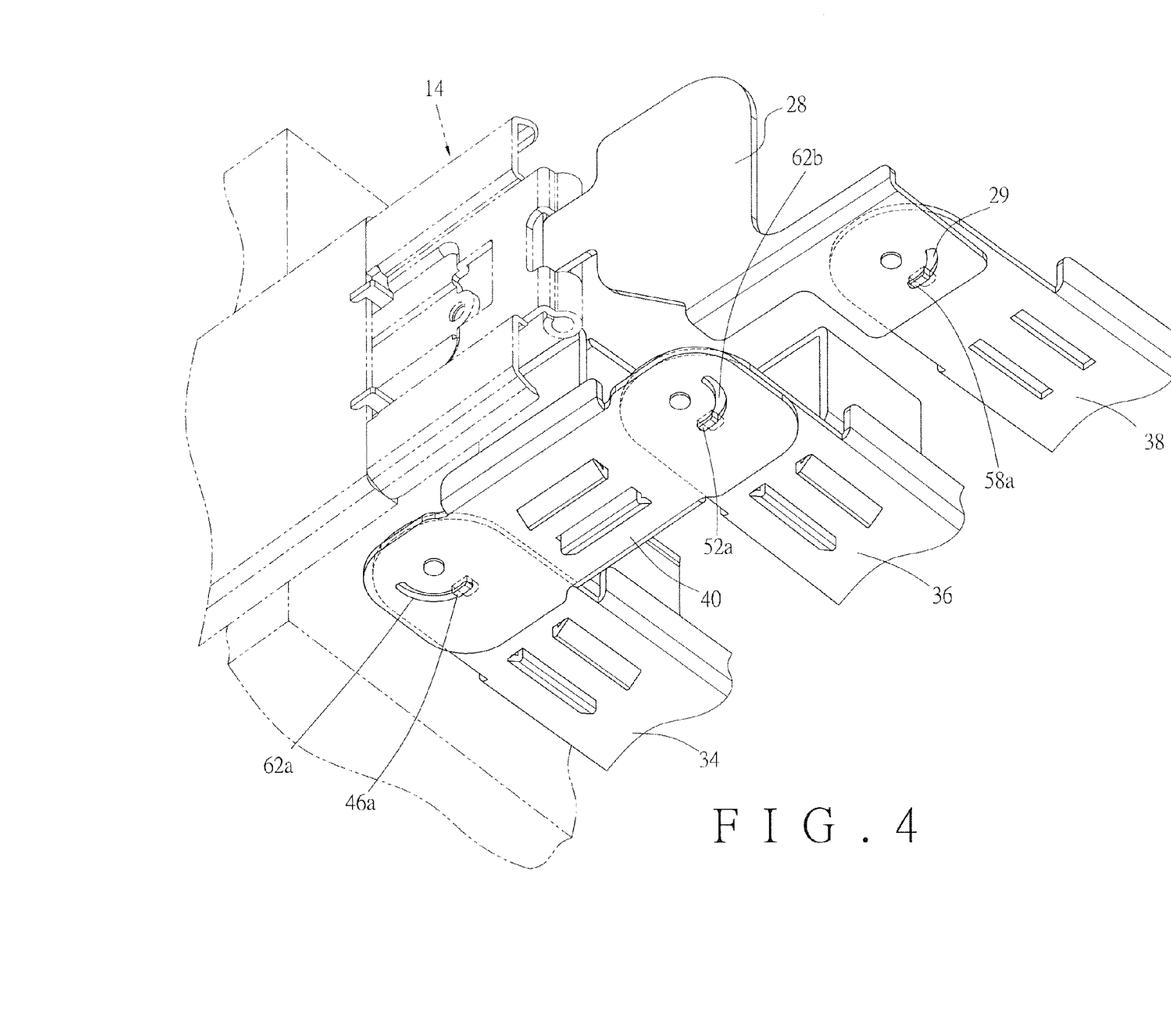
FIG. 4 is a perspective view showing how support arms and a connecting member in the cable management device in FIG. 1 are mounted relative to one another.

As shown in FIG. 4, the first guiding portion 46a of the first support arm 34 can move along and relative to the front guiding portion 62a of the first connecting member 40, the first guiding portion 52a of the second support arm 36 can move along and relative to the rear guiding portion 62b of the first connecting member 40, and the first guiding portion 58a of the third support arm 38 can move along and relative to the curved groove 29 of the second support member 28.

In one preferred embodiment, each of the front guiding portions 62a, 64a and the rear guiding portions 62b, 64b is a curved groove defining a path corresponding to a 90-degree circular arc, and each of the first guiding portions 46a, 52a and the second guiding portions 52b, 58b is a protruding block movable only within the limited space defined by the corresponding curved groove.

It should be noted that the front guiding portions 62a, 64a and the rear guiding portions 62b, 64b may be protruding blocks instead of the curved grooves described above, and the first guiding portions 46a, 52a and the second guiding portions 52b, 58b may be corresponding curved grooves instead of the protruding blocks described above.

Figure 5:
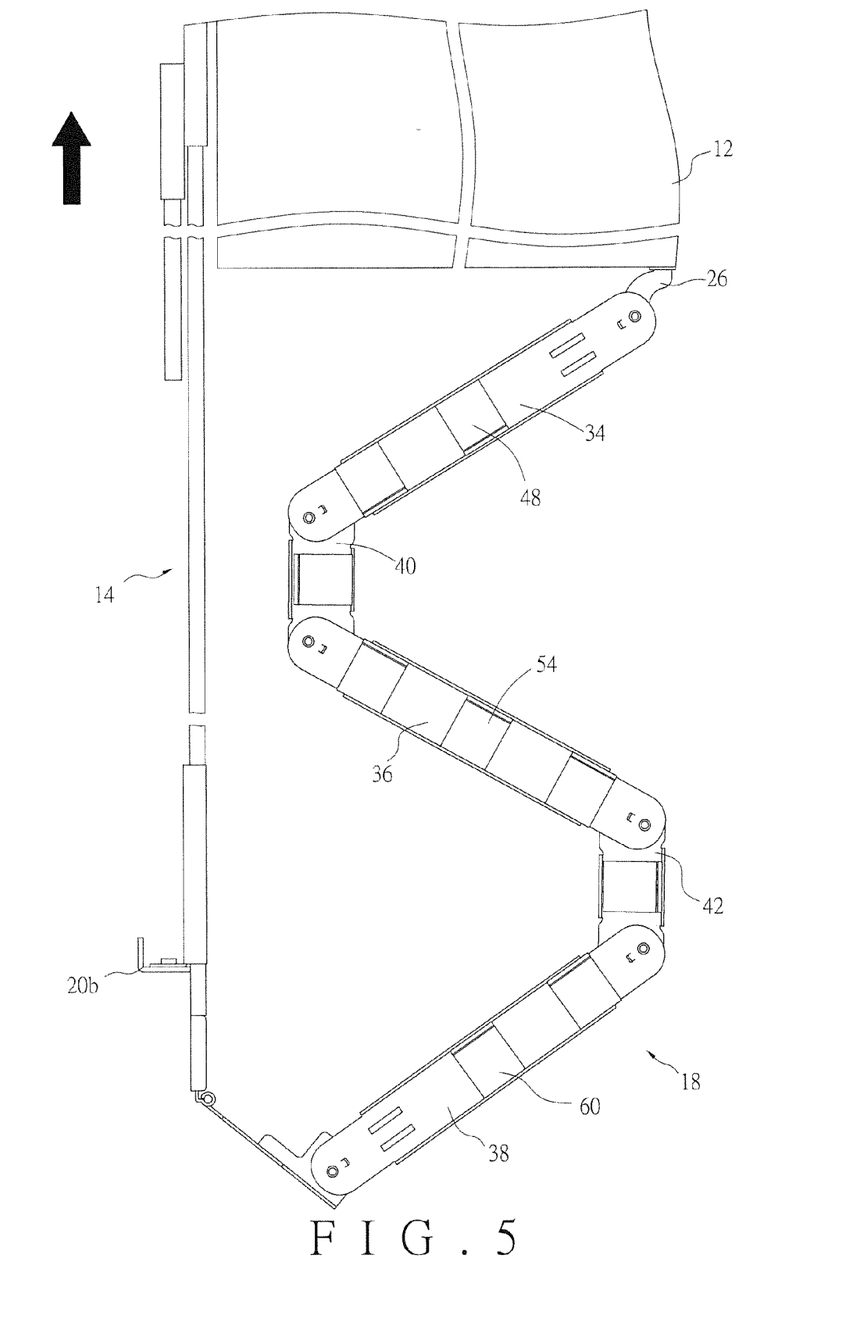
FIG. 5 is a schematic drawing in which one lateral half of the cable management device in FIG. 1 has been extended to a predetermined position.
Figure 6:
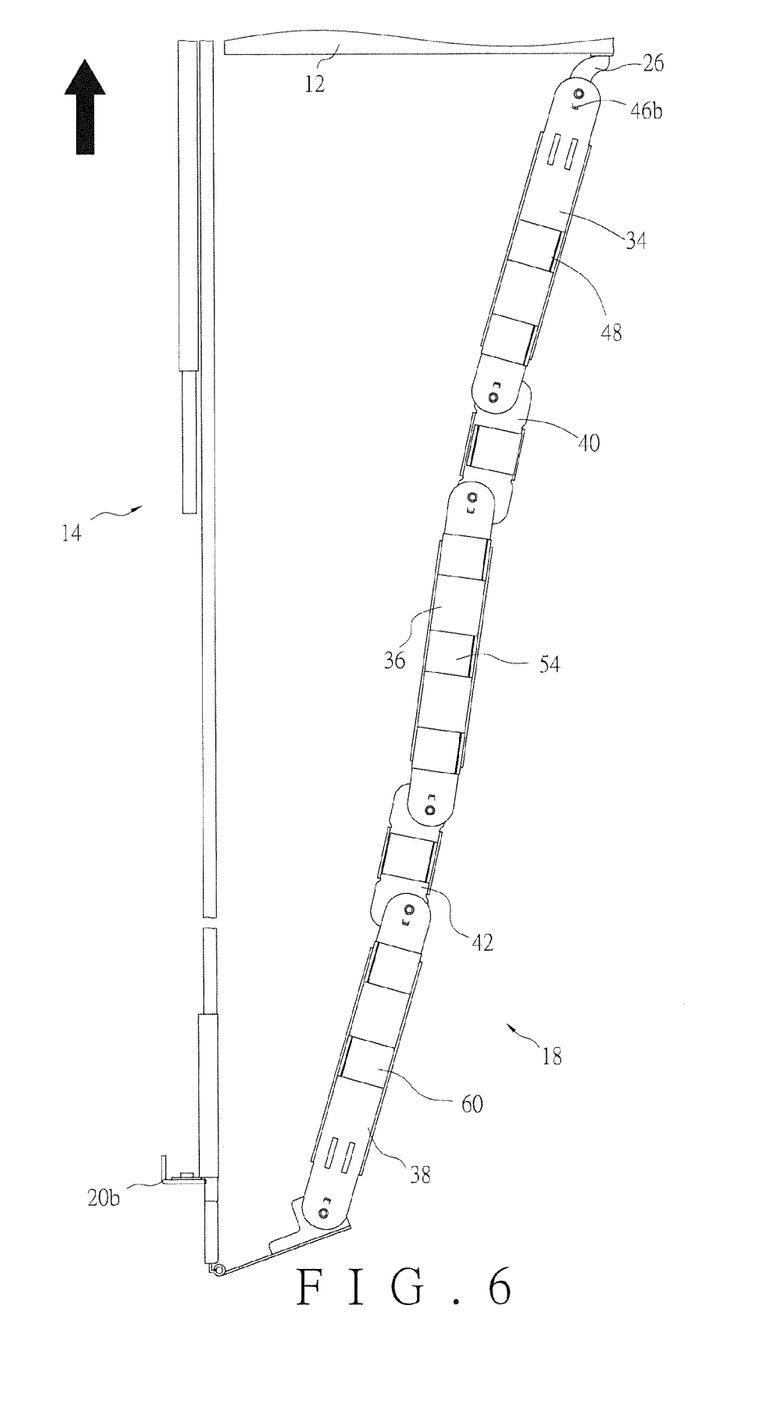
FIG. 6 is a schematic drawing in which one lateral half of the cable management device in FIG. 1 has been fully extended.
Figure 7:
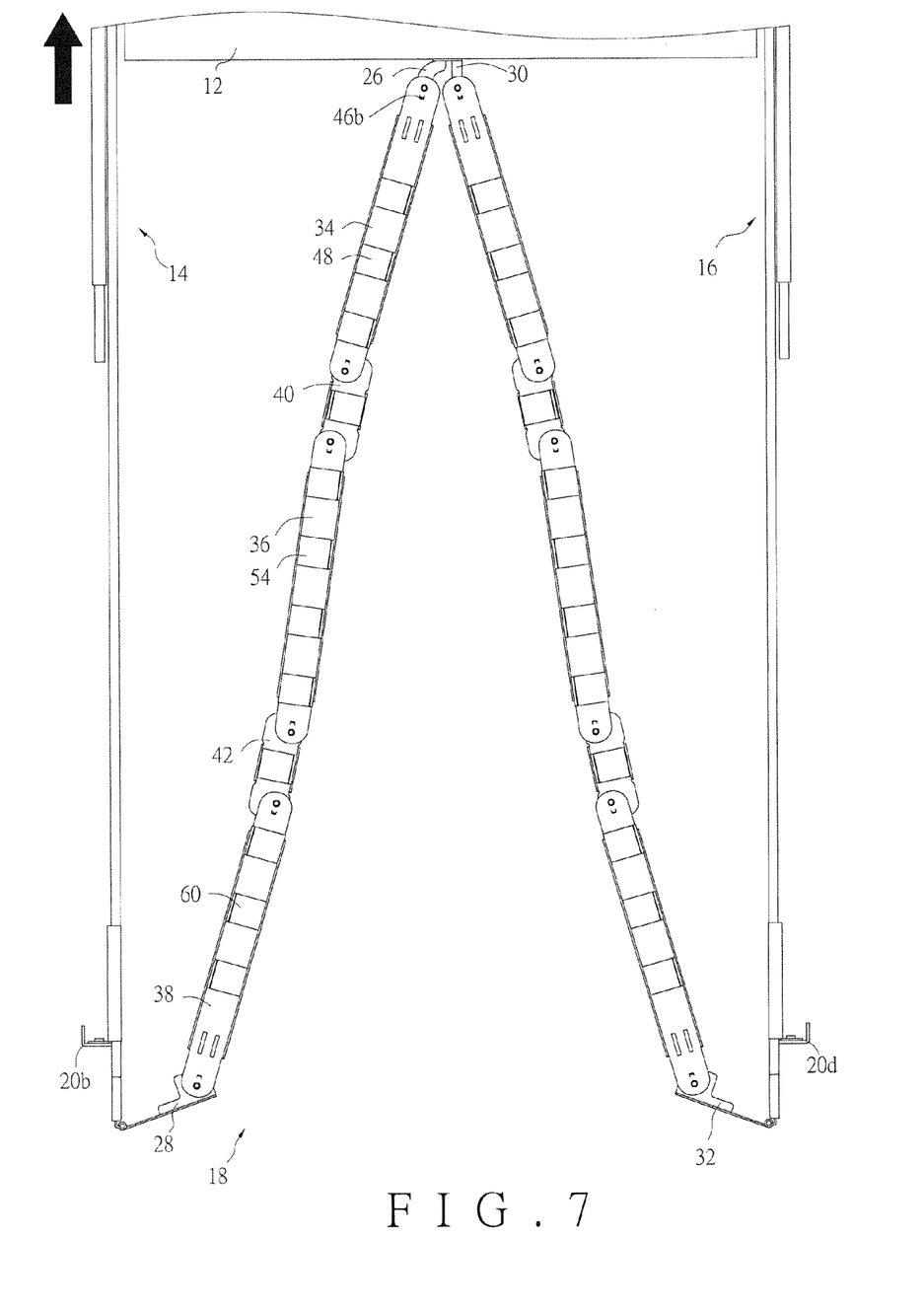
FIG. 7 is a schematic drawing in which both lateral halves of the cable management device in FIG. 1 have been fully extended.

FIG. 5 and FIG. 6 show how the cable management device 18 operates. As shown in FIG. 5, when the chassis 12 is pulled out from the rack 10 by means of the slide rail assemblies (14, 16), the cable management device 18 is driven by the chassis 12 such that the first support arm 34, the first connecting member 40, the second support arm 36, the second connecting member 42, and the third support arm 38 are extended due to the curved groove-and-protruding block connections therebetween. The same curved groove-and-protruding block connections also provide the cable management device 18 with guiding and position-limiting functions, which help maintain the extending direction of the cables received in the cable management elements 48, 54, and 60. In FIG. 6, the cable management device 18 is in a fully extended state. FIG. 7 shows that both lateral halves of the cable management device 18 depicted in FIG. 1 are in the fully extended state.

When the chassis 12 is pushed back from outside of the rack 10 by means of the slide rail assemblies (14, 16), the movable connection between the first support arm 34 and the first support member 26 of the chassis 12 allows the cable management device 18 to be driven by the chassis 12. In other words, the first support arm 34, the first connecting member 40, the second support arm 36, the second connecting member 42, and the third support arm 38 will be folded due to the curved groove-and-protruding block connections therebetween. The same curved groove-and-protruding block connections also provide the cable management device 18 with guiding and position-limiting functions and help maintain the folding direction of the cables received in the cable management elements 48, 54, and 60. The cable management device 18 is thus in the fully folded state as shown in FIG. 3.

Figure 8:
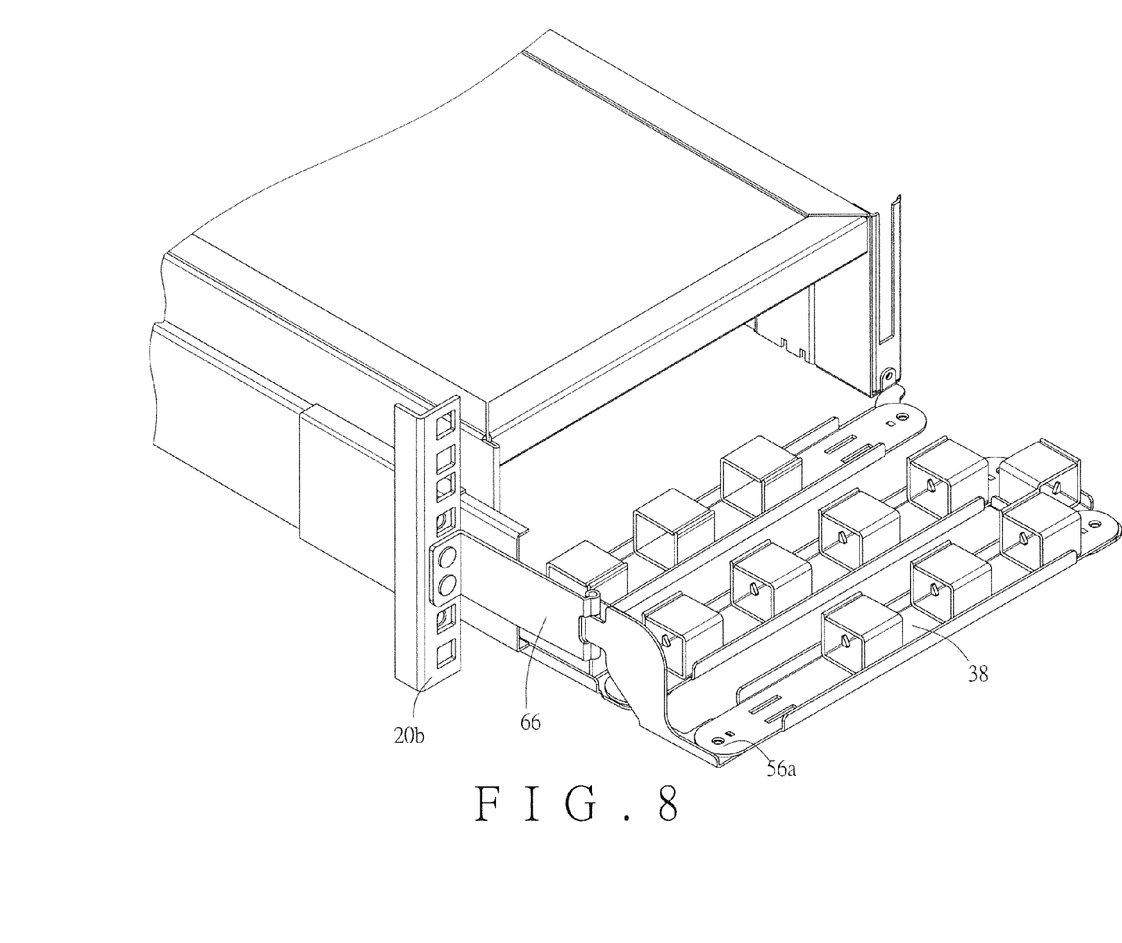
FIG. 8 is a perspective view in which the cable management device in another embodiment of the present invention is connected to a rack.

FIG. 8 shows another embodiment in which the front portion 56a of the third support arm 38 of the first cable management arm 22 is pivotally connected to the second post 20b of the rack via an extension member 66. Similarly, in the other lateral half of the cable management device 18 that is not shown in the drawing, the second cable management arm 24 is pivotally connected to the fourth post 20d via another extension member.

While the present invention has been disclosed through the foregoing preferred embodiments, it is understood that the embodiments are not intended to restrict the scope of the present invention. The scope of the present invention is defined only by the appended claims.

The invention claimed is:

1. A cable management device applicable to a rack server and comprising:
   a first support arm comprising a front portion, a rear portion, and a first guiding portion located at the front portion of the first support arm;
   a second support arm comprising a front portion, a rear portion, and a first guiding portion located at the front portion of the second support arm; and
   a connecting member movably connected between the first support arm and the second support arm, the connecting member comprising a front guiding portion and a rear guiding portion;
   wherein the first guiding portion of the first support arm is movable along and relative to the front guiding portion of the connecting member, and the first guiding portion of the second support arm is movable along and relative to the rear guiding portion of the connecting member; and
   each of the front guiding portion and the rear guiding portion of the connecting member is a curved groove, and each of the first guiding portion of the first support arm and the first guiding portion of the second support arm is a protruding block movable only within a limited space defined by a corresponding one of the curved grooves.

2. The cable management device of claim 1, wherein each of the curved grooves defines a path corresponding to a 90-degree circular arc.

3. A cable management device applicable to a chassis, the chassis having a lateral side mounted to a rack via a slide rail assembly, the cable management device comprising a first cable management arm, the first cable management arm comprising:
- a first support arm comprising a front portion, a rear portion, a first guiding portion located at the front portion of the first support arm, and a second guiding portion located at the rear portion of the first support arm;
- a second support arm comprising a front portion, a rear portion, a first guiding portion located at the front portion of the second support arm, and a second guiding portion located at the rear portion of the second support arm;
- a first connecting member movably connected between the front portion of the first support arm and the front portion of the second support arm, the first connecting member comprising a front guiding portion and a rear guiding portion;
- a third support arm comprising a front portion, a rear portion, a first guiding portion located at the front portion of the third support arm, and a second guiding portion located at the rear portion of the third support arm; and
- a second connecting member movably connected between the rear portion of the second support arm and the rear portion of the third support arm, the second connecting member comprising a front guiding portion and a rear guiding portion;
- wherein the rear portion of the first support arm is movably connected to the chassis; the front portion of the third support arm is movably connected to one of the slide rail assembly and the rack; and when the chassis is pulled out from the rack via the slide rail assembly, the first guiding portion of the first support arm is moved along and relative to the front guiding portion of the first connecting member, the first guiding portion of the second support arm is moved along and relative to the rear guiding portion of the first connecting member, the second guiding portion of the second support arm is moved along and relative to the front guiding portion of the second connecting member, and the second guiding portion of the third support arm is moved along and relative to the rear guiding portion of the second connecting member such that the first support arm, the first connecting member, the second support arm, the second connecting member, and the third support arm are driven to an extended position.

4. The cable management device of claim 3, further comprising a first support member and a second support member, wherein the first support member is connected between the chassis and the rear portion of the first support arm, and the second support member is connected either between the slide rail assembly and the front portion of the third support arm or between the rack and the front portion of the third support arm.

5. The cable management device of claim 4, wherein the second support member has a curved groove corresponding to the first guiding portion of the third support arm, and the first guiding portion of the third support arm is a protruding block movable only within a limited space defined by the curved groove.

6. The cable management device of claim 3, wherein the front guiding portions and the rear guiding portions of the first connecting member and the second connecting member are curved grooves; and the first guiding portion of the first support arm, the first guiding portion and the second guiding portion of the second support arm, and the second guiding portion of the third support arm are protruding blocks respectively movable only within limited spaces respectively defined by the curved grooves.

7. The cable management device of claim 6, wherein each of the curved grooves defines a path corresponding to a 90-degree circular arc.

8. A cable management device applicable to a chassis, the chassis being mounted to a rack via a pair of slide rail assemblies, the cable management device comprising a first cable management arm and a second cable management arm, at least one of the first cable management arm and the second cable management arm comprising:
- a first support arm comprising a front portion, a rear portion, a first guiding portion located at the front portion of the first support arm, and a second guiding portion located at the rear portion of the first support arm;
- a second support arm comprising a front portion, a rear portion, a first guiding portion located at the front portion of the second support arm, and a second guiding portion located at the rear portion of the second support arm;
- a first connecting member movably connected between the front portion of the first support arm and the front portion of the second support arm, the first connecting member comprising a front guiding portion and a rear guiding portion;
- a third support arm comprising a front portion, a rear portion, a first guiding portion located at the front portion of the third support arm, and a second guiding portion located at the rear portion of the third support arm; and
- a second connecting member movably connected between the rear portion of the second support arm and the rear portion of the third support arm, the second connecting member comprising a front guiding portion and a rear guiding portion;
- wherein the rear portion of the first support arm is movably connected to the chassis; the front portion of the third support arm is movably connected to one of the slide rail assemblies or is movably connected to the rack; and when the chassis is pulled out from the rack via the slide rail assemblies, the first guiding portion of the first support arm is moved along and relative to the front guiding portion of the first connecting member, the first guiding portion of the second support arm is moved along and relative to the rear guiding portion of the first connecting member, the second guiding portion of the second support arm is moved along and relative to the front guiding portion of the second connecting member, and the second guiding portion of the third support arm is moved along and relative to the rear guiding portion of the second connecting member such that the first support arm, the first connecting member, the second support arm, the second connecting member, and the third support arm are driven to an extended position.

9. The cable management device of claim 8, further comprising a first support member, a second support member, a third support member, and a fourth support member, wherein the first support member is movably connected between the chassis and the first cable management arm, the second support member is movably connected between the first cable management arm and one of the slide rail assemblies, the third support member is movably connected between the chassis and the second cable management arm, and the fourth support member is movably connected between the second cable management arm and the other one of the slide rail assemblies.

10. The cable management device of claim 9, wherein the first support member and the third support member are respectively connected to the chassis at positions adjacent to a rear middle part of the chassis.

\* \* \* \* \*